United States Patent [19]

Le

[11] Patent Number: 5,535,222
[45] Date of Patent: Jul. 9, 1996

[54] METHOD AND APPARATUS FOR CONTROLLING A PLURALITY OF SYSTEMS VIA A BOUNDARY-SCAN PORT DURING TESTING

[75] Inventor: Duy K. Le, Levittown, Pa.

[73] Assignee: AT&T Corp., Murray Hill, N.J.

[21] Appl. No.: 173,732

[22] Filed: Dec. 23, 1993

[51] Int. Cl.[6] .................................................. G01R 31/28
[52] U.S. Cl. .......................................... 371/22.3; 371/25.1
[58] Field of Search ................................. 371/22.3, 22.1, 371/22.4, 25.1; 324/158 R

[56] References Cited

U.S. PATENT DOCUMENTS

| | | | |
|---|---|---|---|
| 5,198,759 | 3/1993 | Ohnesorge | 324/158 |
| 5,400,345 | 3/1995 | Ryan, Jr. | 371/22.3 |
| 5,416,783 | 5/1995 | Broseghini et al. | 371/22.3 |

OTHER PUBLICATIONS

*IEEE Standard Test Access Port and Boundary–Scan Architecture*, IEEE Std. 1149.1–1990, Ch. 1, pp. 1–1 thru 1–5.

Primary Examiner—Vincent P. Canney
Attorney, Agent, or Firm—Robert B. Levy

[57] ABSTRACT

A plurality of individual systems ($12_o$–$12_n$) are controlled during testing via a test value present on a four-wire Boundary-Scan port (17). To accomplish such control, the test value present at the Boundary-Scan port is shifted through at least one buffer ($16_A$) which generates a control signal on its output lines ($S_o$–$S_7$) in accordance with the test value. The control signal from the buffer controls at least one multiplexer ($18_A$) and demultiplexer ($18_{A'}$) that collectively operate to select one of the systems in accordance with the buffer control signal.

7 Claims, 1 Drawing Sheet

CONTROL
BOUNDARY
SCAN
PORT

METHOD AND APPARATUS FOR CONTROLLING A PLURALITY OF SYSTEMS VIA A BOUNDARY-SCAN PORT DURING TESTING

TECHNICAL FIELD

This invention relates to a technique for controlling a multiplicity of systems (e.g., circuit boards) via a single Boundary-Scan port during testing.

BACKGROUND OF THE INVENTION

There is a trend within the electronics industry towards the design and development of smaller electronic components. This trend has led to the fabrication of circuit boards having an increased component density. As the density of components on a given size circuit board has increased, it has become increasingly more difficult to successfully test the components themselves and the connections between them using the traditional bed-of-nails test technique.

In order to facilitate circuit board testing, a test technique known as Boundary-Scan has been developed. To accomplish Boundary-Scan testing, the architecture of one or more semiconductor devices on the board must be modified such that each device has one or more single-bit register cells (i.e., Boundary-Scan cells). Each Boundary-Scan cell within a Boundary-Scan architecture semiconductor device is coupled to an input/output pin of that device. Additionally, the Boundary-Scan cells within each device are coupled in a serial chain with each serial chain of Boundary-Scan cells in each of the other semiconductor devices on the board to form a single serial register chain. For purposes of discussion, a circuit board having Boundary-Scan architecture devices is itself said to have a Boundary-Scan architecture.

Actual Boundary-Scan testing is carried out by shifting a known stream of bits through the serial chain of Boundary-Scan cells in the semiconductor devices on a circuit board such that each bit is latched in a separate Boundary-Scan cell in the chain. If there are no faults (i.e., all of the Boundary-Scan architecture semiconductor devices are functioning properly, and all of the requisite interconnections between them are present), then the bit latched into each Boundary-Scan cell coupled to separate device output should appear at an input of another device coupled to that device output. The bit present at such an input will be captured so as to replace the bit previously latched into Boundary-Scan cell associated with that device input. By shifting out the stream of bits from the chain of Boundary-Scan cells after capturing, and comparing the stream to an expected set of values obtained under fault-free conditions, a faulty device or a faulty interconnection between devices will thus manifest itself. For a more complete description of the Boundary-Scan test technique, reference should be made to the document *IEEE 1149.1 Test Access Port and Botmdary-Scan Architecture,* published by the IEEE, New York, N. Y. (May, 1990), herein incorporated by reference.

Within an electronic system, such as a telephone switch, there is likely to be a large number of Boundary-Scan architecture circuit boards. One approach to testing such circuit boards via the Boundary-Scan test technique is to daisy-chain the boards together in a single large Boundary-Scan chain and then shift a stream of test values through the chain of circuit boards. The disadvantage of testing a plurality of Boundary-Scan architecture circuit boards in this fashion is the difficulty in determining which board is faulty. Another difficulty with testing a plurality of circuit boards in this fashion is that all of the boards which comprise the Boundary-Scan chain must be present. Otherwise if the chain is broken, the circuit boards cannot be tested.

Rather than test a group of circuit boards in a single chain, it is often more desirable to individually test each board in sequence by multiplexing test information and control signals to the boards. The disadvantage of performing Boundary-Scan testing in this manner is that the larger the number of circuit boards to be individually tested, the larger the number of control lines (i.e., bits) required to select the individual board of interest. The number of control lines n needed to select one of p separate boards is determined by the relationship $p \leq 2^n$. For example, to select one of thirty circuit boards would require five separate control lines. Providing a sufficient number of control lines to control a large number of circuit boards may present difficulties in terms of design and may increase the ultimate cost of testing. In addition, a separate control mechanism (in the form of a dedicated processor bus etc.) would be necessary to drive the parallel control lines.

Thus there is a need for a technique for controlling the testing of a plurality of systems (i.e. circuit boards) which is not subject to the aforementioned disadvantages.

SUMMARY OF THE INVENTION

Briefly, in accordance with the invention, there is provided a method for controlling the testing of a plurality of systems (e.g., circuit boards). The method of the invention is practiced by selecting one of the systems for testing in accordance with a stream of test values present at a four-wire Boundary-Scan port (dedicated for control purposes), thereby allowing any number of systems to be controlled with only the four lines of the Boundary-Scan port. To select the particular system in accordance with the stream of test values present at the Boundary-Scan port, the test values are first shifted through at least one Boundary-Scan buffer having the capability of generating a multi-bit control signal which varies in accordance with the stream of test values shifted therethrough. The control signal generated by the Boundary-Scan buffer is then applied to at least one multiplexer and to at least one demultiplexer. Each multiplexer and demultiplexer pair collectively operates to select a system for testing in accordance with the control signal from the Boundary-Scan buffer. As may be appreciated, the control signals generated by each Boundary-Scan buffer in response to the test value shifted therethrough are, in a sense, addresses which select an appropriate one of the systems for testing.

The advantage of controlling testing in the above-described manner is that a large number of systems can be controlled in accordance with the four lines of the Boundary-Scan port dedicated for control purposes. In other words, one of the systems can be "addressed" using only the four lines of the Boundary-Scan port. Moreover, since the control mechanism includes a Boundary-Scan TAP, similar to a main Boundary-Scan port that is typically present for testing purposes, the control technique of the invention can be implemented within the existing Boundary-Scan architecture. This allows for a simplified design and provides a generic solution to the problem of controlling multiple circuit boards.

DETAILED DESCRIPTION

Figure 1A:
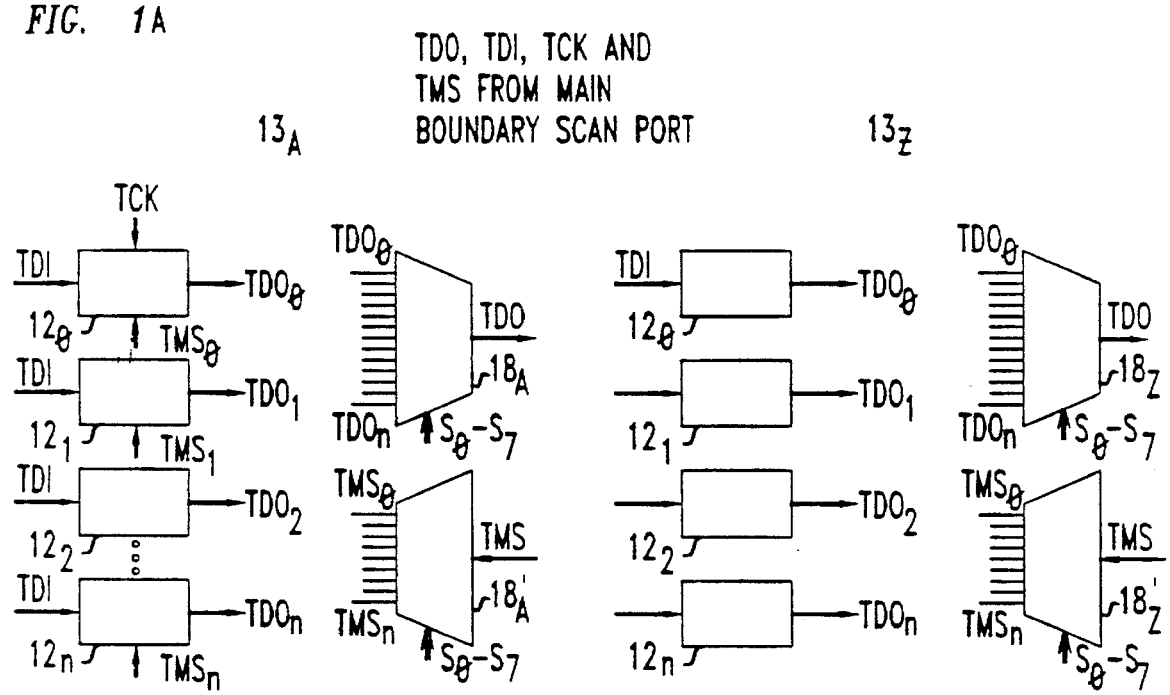
FIG. 1 is a block schematic diagram of a system in accordance with the invention for controlling the testing of a plurality of circuit boards.
Figure 1B:
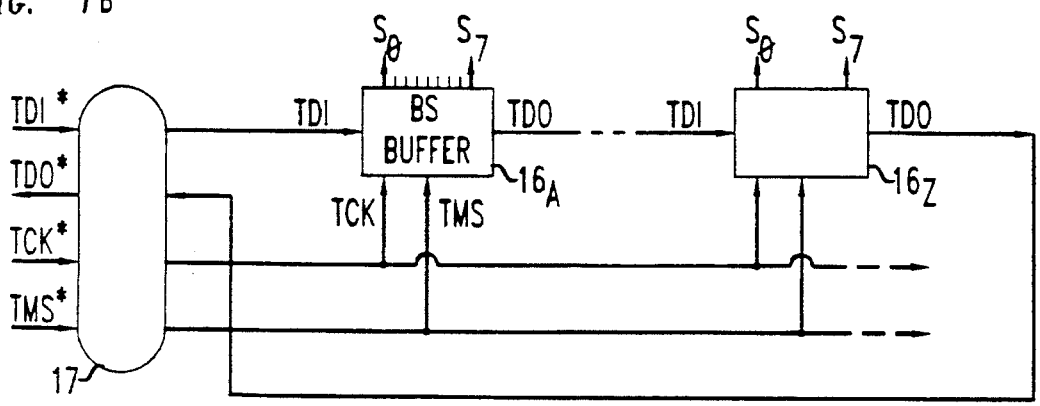

FIG. 1 shows an apparatus 10, in accordance with the invention, for controlling the testing of a plurality of systems 12 arranged such that there are n systems $12_o$–$12_n$ (where n is an integer $\leq 2^8$–1) in each of a plurality of banks $13_A$–$13_Z$ (where A and Z are integers such that A<Z). In practice, each of the systems $12_o$–$12_n$, within each of the banks $13_A$–$13_Z$ typically comprises a Boundary-Scan architecture circuit board having have a Test Data Input (TDI), a Test Data Output (TDO), a Test Clock (TCK) input and a Test Mode Select (TMS) input.

The apparatus 10 includes a plurality of Boundary-Scan architecture buffers $16_A$–$16_Z$, which in the preferred embodiment, correspond in number to the number of banks $13_A$–$13_Z$. In practice, each of the Boundary-Scan buffers $16_A$–$16_Z$ comprises a model 8244 buffer with Boundary-Scan, available from Texas Instruments, Inc., Dallas, Tex. This type of buffer drives eight output lines $S_0$–$S_7$, and by virtue of its Boundary-Scan architecture, this buffer has a Test Data Input (TDI), a Test Data Output (TDO), a Test Mode Select (TMS) input and a Test Clock (TCK) input.

Each of the buffers $16_A$–$16_Z$ receives a Test Mode Select (TMS*) signal at its TMS input, via a Boundary-Scan port 17, for controlling the operation of that buffer. The Boundary-Scan port 17 is dedicated for control purposes (as compared to a conventional Boundary-Scan port which is utilized for Boundary-Scan testing purposes). In this regard, the Boundary-Scan port 17 receives the TMS* signal from an external tester (not shown) that generates the signal in a manner so as to designate which of the buffers $16_A$–$16_Z$ is to be active to control an associated one of the banks $13_A$–$13_Z$. The TMS* signal supplied to the Boundary-Scan port 17 is thus employed to control the buffers $16_A$–$16_Z$ and is designated by the asterisk to distinguish it from a TMS signal which controls the systems $12_0$–$12_n$ in the banks $13_A$–$13_Z$. The TCK input of each of the buffers $16_A$–$16_Z$ is supplied, via the Boundary-Scan port 17, with a Test Clock (TCK*) signal generated by the external tester. The TCK signal clocks each buffer to shift a stream of test information appearing at its TDI through the buffer so that a selected portion of the stream may be latched therein. In accordance with the selected portion of the test information stream latched therein, each of the buffers $16_A$–$16_Z$ generates a multi-bit control signal appearing on its output lines $S_0$–$S_7$.

As indicated, each of the buffers $16_A$–$16_Z$ also has a Test Data Output TDO in addition to its TDI. During operation, test data is shifted into the TDI of each buffer. As test data is shifted into the TDI of each buffer, data that were in the buffer will be pushed out at the TDO. In accordance with the invention, the buffers $16_A$–$16_Z$ are coupled in a daisy-chain fashion so that the TDO of an upstream buffer is coupled to the TDI of a downstream buffer. The TDI and TDO of the buffers $16_A$ and $16_Z$, respectively, are coupled to a TDI* and a TDO*, respectively, of the Boundary-Scan port 17, which receives test information from, and supplies test information to, the external tester. In this way, a stream of test information received at the TDI of buffer $16_A$ via the TDI* of the Boundary-Scan port 17 can be shifted out to the next buffer in the chain. The buffer $16_Z$ has its TDO coupled to the TDO* of the Boundary-Scan port 17 so that the test information shifted out from that buffer will appear at the TDO* of the Boundary-Scan port.

The test information received at the TDI* of the Boundary-Scan port 17, as well as the test information supplied from the TDO*, differs from the test information present at the TDI and TDO of a conventional Boundary-Scan port. The test information provided to the TDI* of the Boundary-Scan port 17 is, in actuality, a stream of addresses which serves to select one of the systems $12_o$–$12_n$ in one of the banks $13_A$–$13_Z$. In other words, a particular stream of test information provided to the TDI* of the Boundary-Scan port 17 designates or addresses a particular one of the systems $12_o$–$12_n$ in one of the banks $13_A$–$13_Z$ The output lines $S_0$–$S_7$ of each of the buffers $16_A$–$16_Z$ to a separate one of a set of multiplexers $18_A$–$18_Z$ and to a separate one of a set of demultiplexers $18_A'$–$18_Z'$, respectively. Thus, for example, the lines $S_0$–$S_7$ of the buffer $16_A$ are coupled to the multiplexer $18_A$ and to the demultiplexer $18_A'$. In response to the control signal received thereby, each of the multiplexers $18_A$–$18_Z$ serves to multiplex (i.e., select) the Test Data Outputs (designated as $TDO_o$–$TDO_n$) of the systems $12_o$–$12_n$, respectively, within that bank associated with the corresponding one of the buffers $16_A$–$16_Z$. Each of the demultiplexers $18_A'$–$18_Z'$ serves to demultiplex the TMS signal from a main Boundary-Scan port (not shown), to render active one of a set of signals $TMS_o$–$TMS_n$, supplied to the TMS input of the systems $12_o$–$12_n$, respectively, in the corresponding one of the banks $13_A$–$13_Z$. Only one of the signals $TMS_o$–$TMS_n$ is active in accordance with the signal appearing on the lines $S_0$–$S_7$ of the corresponding one of the buffers $16_A$–$16_Z$. The non-selected TMS signals are held in a high state as required by the Boundary-Scan standard.

The apparatus 10 operates to control the testing of the systems $12_o$–$12_n$, in the banks $13_A$–$13_Z$ in the following manner. A stream of test information, designating a particular one of the systems $12_o$–$12_n$ in a particular one of the banks $13_A$–$13_Z$ to be tested, is placed on the TDI* of the Boundary-Scan port 17 by the external tester. This stream of information is shifted through the buffers $16_A$–$16_Z$ so that a group of bits in the stream, designating a particular one of the systems $12_o$–$12_n$ in one of the banks $13_A$–$13_Z$, may be latched in the buffer associated with that bank. In accordance with the group of bits latched therein, each buffer provides a signal on its output lines $S_0$–$S_7$ to its associated pair of multiplexers $18_A$–$18_Z$ and alemultiplexers $18_A'$–$18_Z'$, respectively. Each of the multiplexers $18_A$–$18_Z$ multiplexes the Test Data Outputs $TDO_o$–$TDO_n$ of the systems $12_o$–$12_n$ in each bank, while each of the demultiplexers $18_A'$–$18_Z'$ demultiplexes the original TMS signal to yield a select one of the signals $TMS_o$–$TMS_n$ supplied to the systems $12_1$–$12_n$, respectively, in the particular bank for Boundary-Scan testing. Only one of the systems $12_o$–$12_n$, in one of the banks $13_A$–$13_Z$ is selected by the multiplexers and the demultiplexers.

As may now be appreciated, the number of banks $13_A$–$13_Z$ that can be controlled by the apparatus 10 is dependent on the number of buffers $16_A$–$16_Z$, rather than number of the signal lines (i.e., wires ) of the Boundary-Scan port 17. In theory, the number of banks $13_A$–$13_Z$ that may be controlled by the apparatus 10 is unlimited although practical considerations such as propagation delays may limit the number of buffers $16_A$–$16_Z$ that can be chained together, and hence, the number of banks $13_A$–$13_Z$, respectively, that can be controlled.

In the preferred embodiment, the number n of systems in each bank that may be controlled is $\leq 2^8$ (512) because each of the buffers $16_A$–$16_Z$ has only eight output signal lines $S_0$–$S_7$. However, if it is desired to provide a larger number of systems $12_o$–$12_n$ in each of the banks $13_A$–$13_Z$, then each of the buffers $16_A$–$16_Z$ should be chosen so as to provide a larger number of output signal lines. The number of systems $12_o$–$12_n$ in each bank capable of being controlled can be increased by other techniques as well.

The foregoing describes an apparatus 10 for controlling the testing of a plurality of systems $12_o$–$12_n$ in each of a plurality of banks $13_A$–$13_Z$ in accordance with a set of signals present on a four-wire Boundary-Scan port 17. It is to be understood that the above-described embodiments are merely illustrative of the principles of the invention. Various modifications and changes may be made thereto by those skilled in the art which will embody the principles of the invention and fall within the spirit and scope thereof.

I claim:

1. A method for controlling the testing of a plurality of systems, comprising the step of selecting one of the systems for testing in accordance with a stream of test values present on a four-wire Boundary-Scan port, wherein the selecting step comprises the steps of:

shifting the stream of test values present at the Boundary-Scan port through at least one Boundary-Scan buffer which generates a control signal varying in accordance with the test values; and applying the control signal from the Boundary-Scan buffer to at least one multiplexer and one demultiplexer which collectively select a separate one of the systems for testing in accordance with the control signal received by the multiplexer and the demultiplexer from the buffer.

2. The method according to claim 1 wherein the test values present at the Boundary-Scan port are sequentially shifted through the plurality of buffers and wherein the control signal from each buffer is applied to a separate one of a plurality of multiplexers and a plurality of demultiplexers.

3. The method according to claim 1 wherein the control signal from each buffer is applied to a of multiplexer and a demultiplexer, which collectively control a separate set of signals associated with the systems being controlled.

4. A method for controlling the Boundary-Scan testing of a plurality of systems, comprising the steps of:

shifting a stream of test values received from a four-wire Boundary-Scan port through at least one Boundary-Scan buffer which generates a control signal varying in accordance with the test values shifted therethrough; and applying the control signal from the Boundary-Scan buffer to a multiplexer and a demultiplexer which collectively select one of the systems for testing in accordance with the control signal received by the multiplexer and the demultiplexer.

5. The method according to claim 4 including the step of shifting the test value received from the four-wire Boundary-Scan port through a successive one of a plurality of Boundary-Scan buffers, each generating a control signal in accordance with value shifted there through; and applying the control signal generated by each buffer to a separate one of a plurality of multiplexers and demultiplexers, each multiplexer and demultiplexer collectively operative to select one of a group of the systems.

6. Apparatus for controlling a separate one of a plurality of systems in accordance with a test value present at a four-wire Boundary-Scan port, comprising:

at least one Boundary-Scan buffer responsive to the test value present on the Boundary-Scan port for generating a control signal which varies accordingly; and at least one multiplexer and demultiplexer responsive to the Boundary-Scan buffer control signal for selecting a separate one of the systems in accordance with the control signal from the Boundary-Scan buffer.

7. The apparatus according to claim 6 further including:

a plurality of Boundary-Scan buffers coupled in a serial chain such that the test value present at the four-wire Boundary-Scan port may be shifted through the chain of Boundary-Scan buffers in succession, each Boundary-Scan buffer generating a separate control signal in accordance with that portion of the test value shifted therein; and a plurality of multiplexers and demultiplexers, each multiplexer and demultiplexer collectively operative to select one of a group of systems in accordance with the control signal of a separate one of the Boundary-Scan buffers.

\* \* \* \* \*